US006316962B1

United States Patent
Kwon

(10) Patent No.: US 6,316,962 B1
(45) Date of Patent: Nov. 13, 2001

(54) REVERSIBLE ADIABATIC LOGIC CIRCUIT AND PIPELINED REVERSIBLE ADIABATIC LOGIC APPARATUS EMPLOYING THE SAME

(75) Inventor: Ki Paek Kwon, Seoul (KR)

(73) Assignee: Daewoo Electronics Co., Ltd., Seoul (KR)

( * ) Notice: Subject to any disclaimer, the term of this patent is extended or adjusted under 35 U.S.C. 154(b) by 0 days.

(21) Appl. No.: 09/541,175

(22) Filed: Apr. 3, 2000

(30) Foreign Application Priority Data

Apr. 29, 1999 (KR) .................................................. 99-15370

(51) Int. Cl.$^7$ ................................................ H03K 19/096
(52) U.S. Cl. ................................ 326/113; 326/93; 326/96
(58) Field of Search ............................... 326/93–98, 119, 326/121, 112, 113

(56) References Cited

U.S. PATENT DOCUMENTS

| 5,506,520 | * | 4/1996 | Frank et al. | 326/96 |
| 5,602,497 | * | 2/1997 | Thomas | 326/93 |
| 5,986,476 | * | 11/1999 | De | 326/98 |

* cited by examiner

Primary Examiner—Michael Tokar
Assistant Examiner—Don Phu Le
(74) Attorney, Agent, or Firm—Oppenheimer Wolff & Donnelly, LLP

(57) ABSTRACT

A reversible adiabatic logic circuit includes a forward logic function circuit, a reverse logic function circuit, a compensation circuit and a clamping circuit. The forward logic function circuit driven by a first clock among power supply clocks having 8 phases during one time period, computes a forward logic function of a complimentary dual rail circuitry using NMOS transistors and determines charging paths of output nodes. The reverse logic function circuit driven by a second clock behind the first clock by two phases, computes a reverse logic function of the complimentary dual rail circuitry using NMOS transistors and determines discharging paths of output nodes. The compensation circuit compensates a decrease in the swing in the output nodes due to thresholds of the NMOS transistors. The computing units of the forward logic function and the reverse logic function are implemented by NMOS transistors only, and the decrease in the swing of the NMOS transistors is compensated using a pair of PMOS transistors. Therefore, non-adiabatic energy dissipation can be avoided, and the area occupied by the circuit can be greatly reduced compared to the conventional computing units implemented by transmission gates.

10 Claims, 7 Drawing Sheets

FIG. 1 (PRIOR ART)
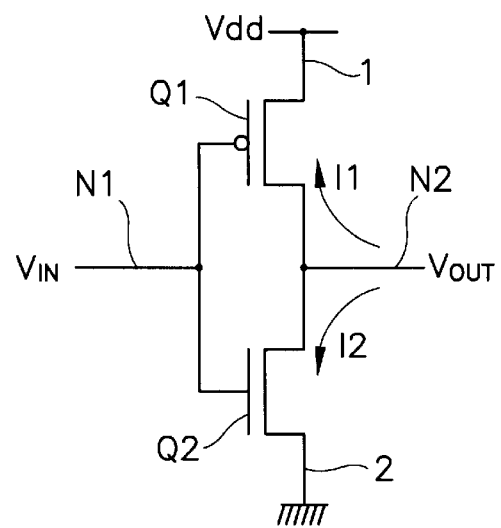
FIG. 2A (PRIOR ART)
FIG. 2B (PRIOR ART)
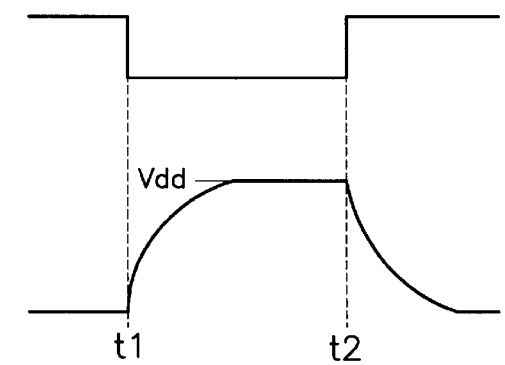

REVERSIBLE ADIABATIC LOGIC CIRCUIT AND PIPELINED REVERSIBLE ADIABATIC LOGIC APPARATUS EMPLOYING THE SAME

BACKGROUND OF THE INVENTION

1. Field of the Invention

The present invention relates to a reversible energy recovery logic circuit, and more particularly, to a reversible adiabatic logic circuit for eliminating non-adiabatic energy loss using a pair of PMOS transistors cross-coupled to an NMOS transistor network, and a pipelined reversible adiabatic logic apparatus employing the same.

2. Description of the Related Art

Adiabatic charging circuits have been steadily studied for attaining low-power consumption MOS logic circuits since they were proposed. In charging a voltage of a node in a standard CMOS logic circuit, assuming that a potential difference between both ends of switch is referred to as $V_{dd}$, power of $(½)C_L V_{dd}^2$ is consumed by switch resistance until the node (having capacitance $C_L$) is completely charged when the switch (e.g., a MOSFET) connected to the power supply is turned off. However, if the voltage of the node becomes equal to the power supply voltage, even if the power supply is connected to the node by the switch, current does not flow into the switch, thereby avoiding power consumption due to the switch resistance.

Therefore, if the power supply voltage is increased relatively slowly, compared to a time constant $RC_L$ between the switch resistance R and the node capacitance $C_L$, the node voltage can be increased to be substantially equal to the power supply voltage while reducing a potential difference between both ends of the switch. Then, the node voltage is conformed to the power supply voltage, thereby adiabatically charging the capacitance of the node. Here, the power dissipated by the switch resistance is represented as:

$$E=I^2RT=(C_L V_{dd}/T)^2 RT=(2RC_L/T)(½C_L V_{dd}^2) \quad \text{Equation (1)}$$

wherein T denotes a time period for charging. Here, if T is infinitive, the power needed for charging the capacitance $C_L$ of the node can be made zero. This charging method is called an adiabatic charging method, which is markedly different from the standard charging method of a CMOS circuit free of the time constant $RC_L$ in context of dissipating energy.

In a CMOS inverter shown in FIG. 1, for example, if an input $V_{IN}$ applied to an input node N1 changes in such a manner as shown in FIG. 2A, an output $V_{OUT}$ of an output node N2 changes in such a manner as shown in FIG. 2B. In other words, if the input $V_{IN}$ ramps down from a high level to a low level at a timing t1, a PMOS transistor Q1 is turned on and an NMOS transistor Q2 is turned off, so that the output node N2 is charged up to the power supply voltage $V_{dd}$ by charging current I1, through the PMOS transistor Q1.

Conversely, if the input $V_{IN}$ ramps up from a low level to a high level at a timing t2, the PMOS transistor Q1 is turned off and the NMOS transistor Q2 is turned on, so that the output node N2 is discharged to a power supply line 2 by discharging current I2, through the NMOS transistor Q2.

Therefore, in the conventional charging method, as shown in FIG. 3, a potential difference V1 between the constant power supply voltage $V_{dd}$, i.e., α1, and the voltage α2 of the output node N2, may cause a switching loss. In this regard, according to the above adiabatic charging method, since the power supply voltage $V_{dd}$ changes as indicated by symbol α3, and the voltage of the output node N2 also changes as indicated by symbol α4 in response to the change of the power supply voltage $V_{dd}$, the loss caused thereby is reduced to a small amount corresponding to a potential difference indicated by symbol V2.

Recently, MOS transistor circuits using the above-described adiabatic charging method have been actively studied. For example, ECRL (Efficient Charge Recovery Logic) using the adiabatic charging method or dual-rail adiabatic logic circuit called a 2N-2N2P circuit has been proposed in publications by Y. Moon and D. K. Jeong, entitled "An Efficient Charge Recovery Logic Circuit," IEEE Journal of Solid-State Circuits, Vol. 31, No. 4, 1996, pp. 514–522, and by A. Kramer, J. Denker and J. Moroney, entitled "$2^{nd}$ Order Adabatic Computation with 2N-2P and 2N-2N2P Logic Circuits," International Symposium on Low Power Design, 1995, pp. 191–196.

However, these adiabatic logic circuits are associated with a non-adiabatic loss in addition to the adiabatic loss expressed in Equation (1). In the case of the 2N-2N2P circuits and ECRL circuits, the non-adiabatic loss is generated by a potential difference between both ends of a switch during a switching operation. In other words, in the 2N-2N2P circuits, an energy loss corresponding to $C_L V_{dd} V_{th}$ is generated by a diode used for precharging of the circuits. In the ECRL circuits, an energy loss corresponding to $(½)C_L V_{th}^2$ is generated by threshold voltages ($V_{th}$) of MOS transistors.

In order to avoid the non-adiabatic energy loss, the following two requirements must be satisfied. First, only when there is no potential difference between both ends of a switch (e.g., MOSFET), the switch must be turned on. When the switch is turned on in the presence of a potential difference between both ends thereof, an abrupt change in the voltage makes a large amount of current flow in the switch due to resistance present therein, thereby generating heat, which implies an energy loss. Second, once the switch is turned on, the energy must be slowly transferred so that a potential difference may not produced at both ends of the switch. The above-described adiabatic charging method has been proposed for satisfying these two requirements.

In order to supply the energy of a node and restore the same while satisfying the two requirements, it is necessary to know the state (or voltage) of the node, which can be solved by using reversible logic. The reversible logic is capable of reverse computation and allows the energy of an input stage to be restored by deriving an input value from an output value through a reverse logic function circuit. Therefore, the reversible logic can be used for restoration of energy.

One approach to low-power circuits using the reversible logic concept is reversible computer technology. Research into reversible computer systems aims at developing computers in which energy or power dissipation is very low. This is based on a physical theory asserting that no data loss leads to avoidance of energy loss, and those computers are promising next-generation computer models which can solve problems of heat and life. The important fields to which the reversible computer technology can be applied include a transplantation field of artificial internal organs, which requires extremely small power consumption. According to physical theories, computers can be designed so as not to consume energy if only reversible computation is allowed. Thus, reversible computers must be implemented using, reversible logic for reversible computation. However, most of conventional computation logic systems are irreversible. Thus, many approaches for converting the irreversible logic system into reversible ones have been disclosed. Existing Boolean functions which are mostly irreversible must be converted into reversible logic systems for being used, which may, however, cause an increase in the complexity. However, the complexity problem can be expected to overcome by the development of high-level integration technology. Ultimately, in view of minimization of energy dissipation, implementation of reversible logic circuits is a very important approach.

Logic elements and apparatuses for reducing energy dissipation using the above-described reversible logic and adiabatic charging method, have been disclosed in an article proposed by S. G. Younis and T. Knight, entitled "Asympotically Zero Energy Split-Level Charge Recovery Logic," Workshop on Low Power Design, 1994, pp. 177–182, and an article proposed by W. C. Athas, L. Swensson, J. G. Koller, N. Tzartzanis and E. Y. -C. Chou, entitled "Low Power Digital Systems Based on Adiabatic Switching Principles," IEEE Trans, on VLSI Systems, 1994, pp. 398–407.

FIGS. 4 through 7 show a logic circuit disclosed by Athas et al. FIG. 4 shows irreversible pipeline connection, in which thick arrows indicate charging/discharging paths or directions. FIG. 5 partially shows the pipelined reversible structure shown in FIG. 4, illustrating an exemplary implementation of a buffer using transmission gates. FIG. 6 is a timing diagram of power clocks used in FIGS. 4 and 5, in which the power clocks have 8 phases and neighboring clocks have a phase difference of at least ⅛ a time period. FIG. 7 is a waveform diagram for illustrating the operation of various nodes. FIG. 8 briefly shows an exemplary implementation of a logic function computing unit and a complementary logic function computing unit, for obtaining the sum (S=a XOR b XOR $C_{in}$) of a full adder in FIG. 5, in which a switch and a clamping circuit are not shown.

In FIG. 5, a switch implemented by transmission gates is in a positive logic level. Thus, a complementary dual rail circuit for receiving two complementary inputs and computing two complementary outputs is used for generating a negative logic value. One rail of the circuit computes an output value of a positive logic level, and the other rail thereof computes an output value of a negative logic level, the two output values to be used as inputs of the next stage. In the complementary dual rail circuit, since one rail is turned off, it may be affected by capacitive coupling in a chip. To overcome this problem, a clamping circuit 15 is provided. The clamping circuit 15 consists of two NMOS transistors M9 and M10, and forces one rail to be coupled to a ground port while the other rail is turned on.

However, in the logic circuit shown in FIGS. 4 and 5, an identical clock is used as charging and discharging clocks in computing logic functions. For example, in a first-stage forward logic function circuit F and a second-stage reverse logic function circuit $G^{-1}$, an identical clock $\phi_0$ is used as charging and discharging clocks. Thus, non-adiabatic energy dissipation is caused, which will now be described in detail with reference to FIGS. 5 to 7.

First, it is assumed that internal nodes n1, n2, n3 and n4 are grounded at an initial stage, and two switches T5 and T6 are turned on. When T=0, an input $\alpha_0$ is valid to a logic high level. When T=1, an output node $X_1$ is driven to a logic high level, and its complementary output node $/X_1$ is grounded by the clamping circuit 15. Simultaneously, as the PMOS transistor (not shown) of transmission gates T3 and T4 are turned on, the nodes n3 and n4 are charged. Here, since inputs $\beta_2$ and $/\beta_2$ are at an idle state when T=1, they are kept being grounded. When T=3, a clock $\phi3$ goes high and switches T7 and T8 are turned on. Then, the charged node n4 is connected to the grounded node $/X_1$ so that the non-adiabatic loss as indicated by a circle "A" in FIG. 7 is generated. When T=4, the inputs $\alpha_0$ and $/\alpha_0$ goes to an idle state so that the discharged node n2 is connected to the clock $\phi_3$ being at a high level. Accordingly, the non adiabatic loss as indicated by a circle "B" in FIG. 7 is generated.

Referring to FIG. 5, in the forward logic function circuit or reverse logic function circuit 11 or 13 including two switches T5 and T6 or T7 and T8, respectively, the logic circuits for computing a forward logic function, a reverse logic function and their complementary logic functions are implemented using transmission gates. The transmission gates are driven such that the source of the NMOS transistor and the drain of the PMOS transistor are connected to each other, the source and drain being used as both ends of a switch, the input is connected to the gate of the NMOS transistor, and its complementary input is connected to the gate of the PMOS transistor. Then, energy is transferred to both ends of the switch without a voltage drop. The transmission gate is known as the most stable switch that is implemented by MOS transistors. However, since the transmission gates are implemented using a pair of NMOS and PMOS transistors, the circuitry becomes bulky and energy dissipation increases.

SUMMARY OF THE INVENTION

To solve the above problems, it is an object of the present invention to provide a reversible adiabatic logic circuit for implementing a forward logic function, a reverse logic function and their complementary logic functions by using only NMOS transistors in a forward logic function circuit or a reverse logic function circuit, and for compensating reduction in the swing while the NMOS transistors operate, which is due to a threshold voltage, by using a pair of PMOS transistors.

It is another object of the present invention to provide a pipelined reversible adiabatic logic apparatus having unit reversible adiabatic logic circuits.

According to the present invention, there is provided a reversible adiabatic logic circuit comprising: a forward logic function circuit driven by a first clock among power supply clocks having at least 8 phases during a time period, the forward logic function circuit for computing a forward logic function of a complementary dual rail using one or more NMOS transistors and determining the charging path of output nodes; a reverse logic function circuit driven by a second clock, at least 2 phases behind the first clock, the reverse logic function circuit for computing a reverse logic function of the complementary dual rail using one or more NMOS transistors and determining the discharging, path of the output nodes; and a compensation circuit for compensating a decrease in the swing of the output nodes due to threshold voltages of the NMOS transistors in the forward logic function circuit and the reverse logic function circuit.

According to another aspect of the present invention , there is provided a pipelined reversible adiabatic logic apparatus having unit reversible adiabatic logic circuits, each comprising: a forward logic function circuit driven by a first clock among power supply clocks having at least 8 phases during a time period, the forward logic function circuit for computing a forward logic function for the output value of a previous stage and its complementary forward logic function using one or more NMOS transistors; a reverse logic function circuit driven by a second clock, at least 2 phases behind the first clock, the reverse logic function circuit for computing a reverse logic function of the output value of a next stage and its complementary reverse logic function using one or more NMOS transistors; and a compensation circuit for compensating a decrease in the swing of the output nodes due to threshold voltages of the NMOS transistors in the forward logic function circuit and the reverse logic function circuit, wherein the unit reversible adiabatic logic circuits are pipelined and the forward logic function circuit of the unit reversible adiabatic logic circuit of the next stage is driven by a clock, one phase behind the first clock.

BRIEF DESCRIPTION OF THE DRAWINGS

The above object and advantages of the present invention will become more apparent by describing in detail a preferred embodiment thereof with reference to the attached drawings in which:

FIG. 1 is a circuit diagram of a CMOS inverter, for explaining charging/discharging operation;

FIGS. 2A and 2B are waveform diagrams for explaining the operation of the CMOS inverter shown in FIG. 1;

DESCRIPTION OF THE PREFERRED EMBODIMENTS

Hereinafter, a preferred embodiment of the present invention will be described in detail with reference to the accompanying drawings.

Figure 5:
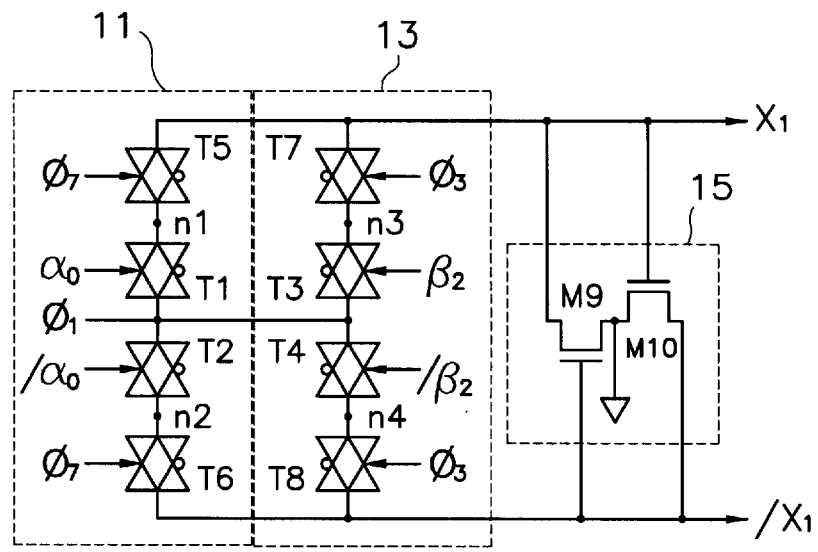
FIG. 5 partially shows the pipelined reversible structure shown in FIG. 4, illustrating an exemplary implementation of a buffer using transmission gates.
Figure 6:
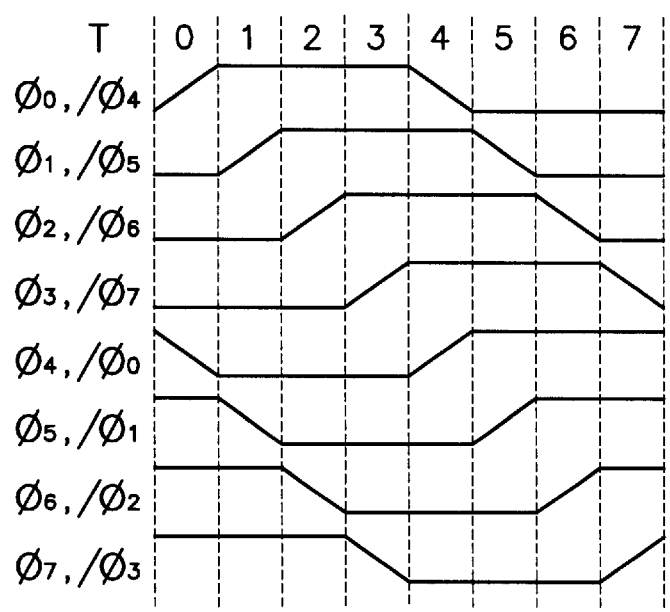
FIG. 6 is a timing diagram of clocks used in FIGS. 4 and 5.
Figure 7:
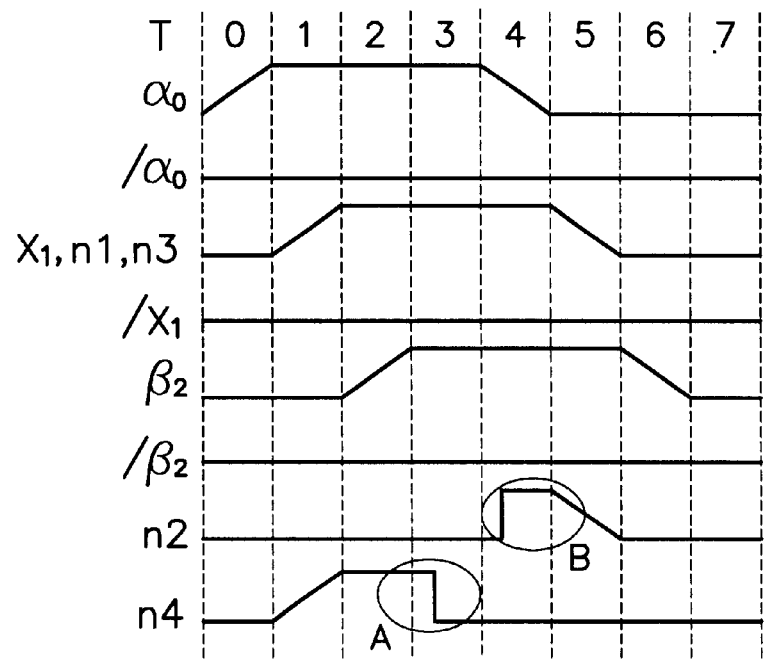
FIG. 7 is a waveform diagram for explaining the operation of various nodes shown in FIG. 5.
Figure 8:
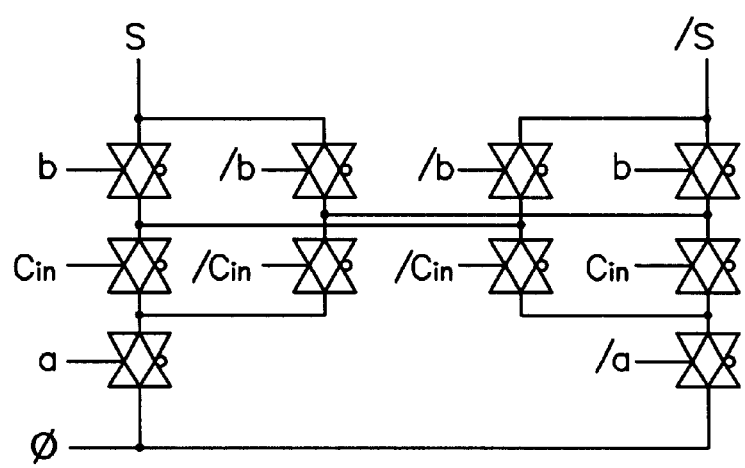
FIG. 8 shows an exemplary implementation of a logic function computing unit and a complementary logic function computing unit of a full adder using transmission gates in FIG. 5.
Figure 9:
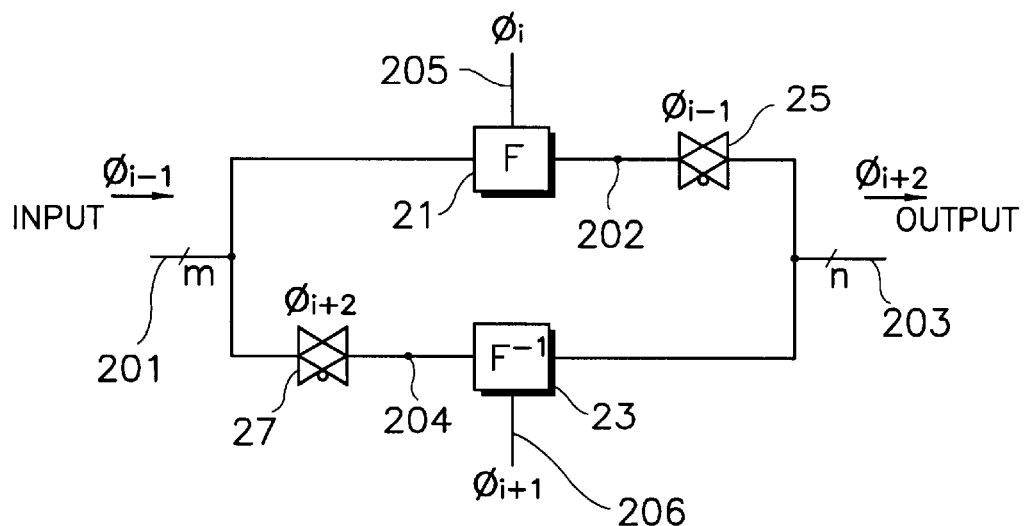
FIG. 9 is a circuit diagram of a reversible logic circuit according to the present invention.

FIG. 9 is a circuit diagram of a reversible logic circuit used in the present invention, which consists of a forward logic function computing unit 21, a reverse logic function computing unit 23, and first and second switches 25 and 27. Here, the same power supply clock as that shown in FIG. 6 is used as a power supply clock. In other words, the power supply clock makes a transition between the maximum power supply voltage $V_{dd}$ and the minimum power supply voltage GND (0V), slowly, e.g., for ⅛ one-time period, and has 8 phases $\phi_0$ through $\phi_7$. Unlike the circuit shown in FIG. 4 or 5 in which an identical power supply clock is used as charging and discharging clocks in computing logic functions, different power supply clocks are used in FIG. 9, thereby avoiding generation of non-adiabatic loss.

The forward logic function computing unit 21 connected to a clock $\phi_i$, receives energy from the a clock $\phi_i$, computes a predetermined logic function with respect to an input value having a predetermined number of bits, m, which receives energy from a clock $\phi_{i-1}$, at least one phase ahead of the clock $\phi_i$, and restores the energy used as the output value when the clock $\phi_i$ makes a transition from the maximum power supply voltage to the minimum power supply voltage after computation of a reverse logic function of the forward logic function at a subsequent stage. Also, in order for the forward logic function computing unit 21 to compute the output value while the clock $\phi_i$ goes to the maximum power supply voltage, the following conditions must be satisfied, the forward logic function computing unit 21 should have an input value applied when the clock $\phi_i$ is at the minimum power supply voltage, and the first switch 25 should be turned on. In other words, energy is supplied by connecting the forward logic function computing unit 21 with a supply clock 205 to compute an n-bit interim value 202 and an output value 203 from an m-bit input value 201.

The first switch 25 is connected to a clock $\phi_{i-1}$, at least one phase ahead of the clock $\phi_i$, and controls the output value computed in the forward logic function computing unit 21 to be transferred to a next stage using the clock $\phi_{i-1}$, without energy dissipation. Also, the first switch 25 is in an OFF state when the clock $\phi_{i-1}$ is at the minimum power supply voltage, and is in an ON state when the clock $\phi_{i-1}$ is at the maximum power supply voltage. In other words, the interim value 202 and the output value 203 are connected to each other for energy supply, and they are disconnected from each other for energy restoration.

The reverse logic function computing unit 23 computes a reverse logic function of the forward logic function with respect to the output value of the first switch 25. Also, the reverse logic function computing unit 23 is connected to a clock $\phi_{i+1}$, at least one phase behind the clock $\phi_i$, and restores the energy used as the input value after computation of the reverse logic function. In other words, an interim value 204 is computed using the output value 203. Also, the reverse logic function computing unit 23 computes the output value while the clock $\phi_{i+1}$ goes to the maximum power supply voltage, when the following conditions are satisfied, that is, the input value of the forward logic function computing unit 21 is known, the second switch 27 is turned off and the result value of the forward logic function computation is known. Further, the reverse logic function computing unit 23 restores the energy of the input value to the clock $\phi_{i+1}$, while the clock $\phi_i$ goes from the maximum power supply voltage to the minimum power supply voltage.

The second switch 27 is connected to a clock $\phi_{i+2}$, at least one phase behind the clock $\phi_{i+1}$ connected to the reverse logic function computing unit 23, and controls the output value of the reverse logic function computing unit 23 to be connected to the input value of the forward logic function computing unit 21 using the clock $\phi_{i+2}$, for restoring the energy of the input value of the forward logic function computing unit 21 into the clock $\phi_{i+1}$ connected to the reverse logic function computing unit 23. Also, the second switch 27 is in an OFF state when the clock $\phi_{i+2}$ is at the minimum power supply voltage, and is in an ON state when the clock $\phi_{i+2}$ is at the maximum power supply voltage. In other words, the interim value 204 of the reverse logic function computing unit 23 and the input value 201 are connected to each other for energy restoration to produce a restored clock 206 and then disconnected from each other.

The operation of the above-described parts will now be described with reference to the power supply clock shown in FIG. 6. For convenience sake of explanation, 'i' is set to 2.

When T=0, the potentials of all nodes and supply clocks shown in FIG. 9 are grounded. When T=1, the input value 201 is applied in synchronization with a clock $\phi_1$, one phase ahead of a clock $\phi_2$ of the forward logic function computing unit 21, and the first switch 25 is turned on in synchronization with the clock $\phi_1$, so that the interim value 202 and the output value 203 are connected to each other. Here, the first switch 25 has no potential difference between both ends thereof. Thus, even if the first switch 25 is turned on, the energy is not dissipated. When T=2, the interim value 202 and the output value 203 are computed while a clock $\phi_2$ goes to the maximum power supply voltage level. Then, the output value 203 is applied to the reverse logic function computing unit 23. When T=3, the interim value 204 equal to the input value is computed while a clock $\phi_3$ goes to the maximum power supply voltage level. This is because the input value is computed as the same value as the original input value while passing through the forward logic function computing unit 21 and the reverse logic function computing unit 23. When T=4, a clock $\phi_4$ goes to the maximum power supply voltage level and the second switch 27 is turned on. Since the second switch 27 has no potential difference between both ends thereof, like the first switch 25, even if the second switch 27 is turned on, the energy is not dissipated. When T=5, the clock $\phi_1$ goes to the minimum power supply voltage level and the first switch 25 is turned off, so that the interim value 202 and the output value 203 are disconnected from each other. When T=6, the clock $\phi_2$ goes to the minimum power supply voltage level to then restore the energy of the interim value 202 to the clock $\phi_2$. When T=7, the clock $\phi_3$ goes to the minimum power supply voltage level to then restore the energy of the input value 201 and interim value 204 to the clock $\phi_3$. When T=8, the clock $\phi_4$ goes to the minimum power supply voltage level and the second switch 27 is turned off. Then, the interim value 204 and the input value 201 are disconnected from each other, and simultaneously the energy of the output value 203 is restored into the clock $\phi_4$. At this stage, that is, when T=8, the same state as that when T=0 is led, thereby completing the one-cycle operation.

Figure 10:
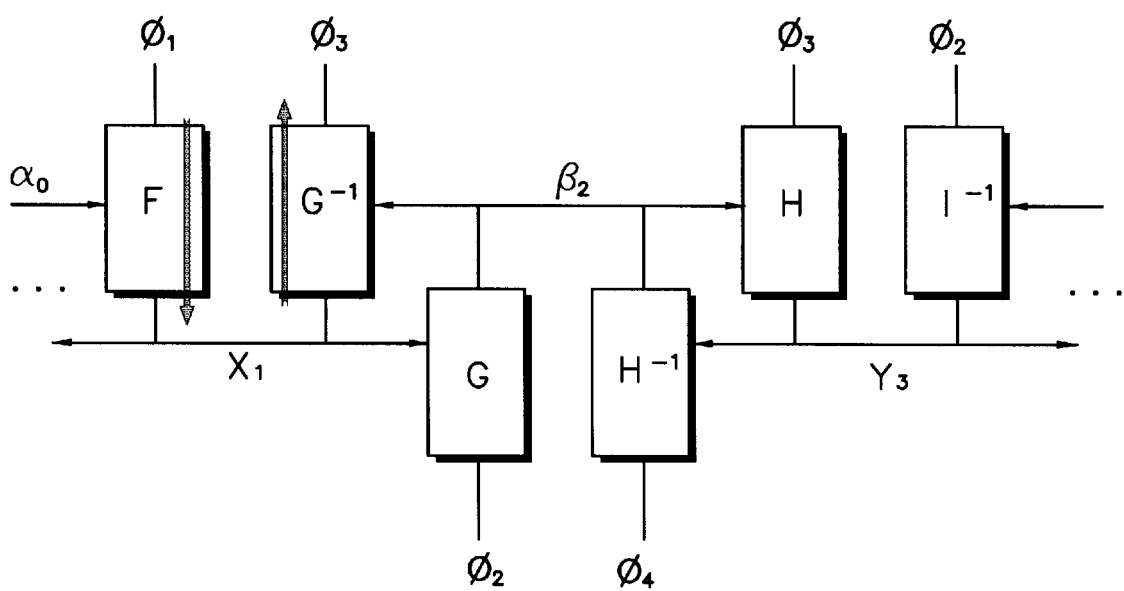
FIG. 10 shows a pipelined reversible structure according to the present invention.

FIG. 10 shows a pipelined reversible structure according to the present invention using the reversible logic circuit shown in FIG. 9, in which thick arrows indicate energy charging/discharging paths or directions. The operating principle of the reversible logic circuit shown in FIG. 9 is applied a first-stage forward logic function circuit F, its reverse logic function circuit $F^{-1}$ (not shown), a second-stage forward logic function circuit G, its reverse logic function circuit $G^{-1}$, a third-stage forward logic function circuit H, its reverse logic function circuit $H^{-1}$, a fourth-stage forward logic function circuit I (not shown) and its reverse logic function circuit $I^{-1}$, to then be pipelined.

FIG. II partially shows the pipelined reversible structure shown in FIG. 10, which consists of a first-stage forward logic function circuit 31 (F in FIG. 10), a second-stage reverse logic function circuit 33 ($G^{-1}$ in FIG. 10), a compensation circuit 35 and a clamping circuit 37.

Here, the first-stage forward logic function circuit 31 includes a forward logic function computing unit (f) 311 to which an input value $\alpha_0$ and a clock $\phi_1$ are applied, a first switch (e) 315 which is connected to the output of the forward logic function computing unit 311 and receives a clock $\phi_0$, a complementary forward logic function computing unit (/f) 313 to which a complementary input value /$\alpha_0$ and a clock $\phi_1$ are applied, a second switch (e) 317 which is connected to the output of the complementary forward logic function computing unit 313 and receives a clock $\phi_0$. Here, the forward logic function computing unit 311 and the complementary forward logic function computing unit 313 compute forward logic functions on a complementary dual rail, and determine charging paths of output nodes $X_1$ and /$X_1$.

Also, the second-stage reverse logic function circuit 33 includes a reverse logic function computing unit ($g^{-1}$) 331 to which an input value $\beta_2$ which is the output of the second-stage forward logic function circuit (G in FIG. 10) and a clock $\phi_3$ are applied, a third switch (e) 335 which is connected to the output of the reverse logic function computing unit 331 and receives a clock $\phi_4$, a complementary reverse logic function computing unit (/$g^{-1}$) 333 to which a complementary input value /$\beta_2$ which is the complementary output of the second-stage forward logic function circuit (G in FIG. 10) and the clock $\phi_3$ are applied, a fourth switch (e) 337 which is connected to the output of the complementary reverse logic function computing unit 333 and receives the clock $\phi_4$. Here, the reverse logic function computing unit 331 and the complementary reverse logic function computing unit 333 compute reverse logic functions on the complementary dual rail, and determine discharging paths of the output nodes $X_1$ and /$X_1$.

In the forward logic function circuit 31 and the reverse logic function circuit 33, the first through fourth switches 315, 317, 335 and 337 are used as disconnection switches for disconnecting the charging and discharging paths.

The compensation circuit 35 includes a first PMOS transistor QP1 in which a drain and a source are connected to the output of the forward logic function computing unit 311 and the clock $\phi_1$, respectively, a second PMOS transistor QP2 in which a gate is connected to the gate of the first PMOS transistor QP1, and a drain and a source are connected to the output of the reverse logic function computing unit 331 and the clock $\phi_3$, respectively, a third PMOS transistor QP3 in which a drain and a source are connected to the output of the complementary forward logic function computing unit 313 and the clock $\phi_1$, respectively, a fourth PMOS transistor QP4 in which a gate is connected to the gate of the third PMOS transistor QP3, and a drain and a source are connected to the output of the complementary reverse logic function computing unit 333 and the clock $\phi_3$, respectively. Here, the node of the gate of the first PMOS transistor QP1 and that of the second PMOS transistor QP2 is connected to the output $X_1$ of the first and third switches 315 and 335. Also, the node of the gate of the third PMOS transistor QP3 and that of the fourth PMOS transistor QP4 is connected to the output /$X_1$ of the second and fourth switches 317 and 337.

TIhe clamping circuit 37 includes first and second NMOS transistors QN1 and QN2 connected in series. The gate of the first NMOS transistor QN1 is connected to the output $X_1$ and that of the second NMOS transistor QN2 is connected to its complementary output /$X_1$. The clamping circuit 37 is used in maintaining a non-driven output of either the output $X_1$ or its complementary output /$X_1$ to be grounded.

Figure 11:
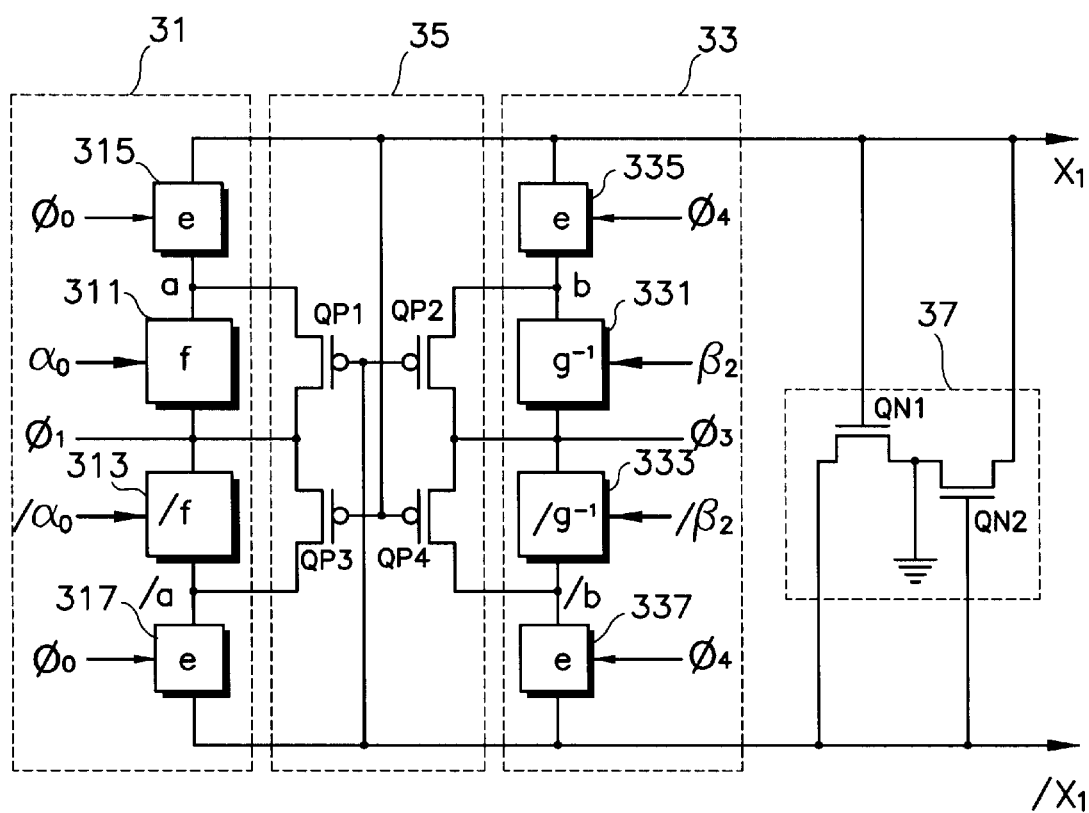
FIG. 11 partially shows the a pipelined reversible structure shown in FIG. 10.
Figure 12:
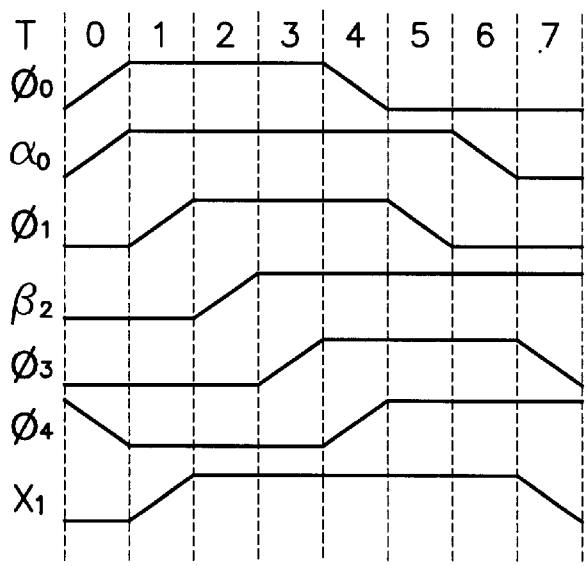
FIG. 12 is a waveform diagram for explaining the operation of various nodes shown in FIG. 11.

Now, the operation of the circuit shown in FIG. 11 will be described with reference to FIG. 12.

First, it is assumed that all nodes are grounded at an initial stage, and the functions f ($\alpha_0$, /$\alpha_0$) and $g^{-1}$ ($\beta_2$, /$\beta_2$) are true.

When T=0, forward disconnection switches synchronized with the clock $\phi_0$, that is, the first and second switches 315 and 317, are in ON states because the clock $\phi_0$ ramps up from a logic low level to a logic high level, and backward disconnection switches synchronized with the clock $\phi_4$, that is, the third and fourth switches 335 and 337, are in OFF states because the clock $\phi_4$ ramps down from a logic high level to a logic low level. Also, the inputs $\alpha_0$ and $/\alpha_0$ become valid after the clock $\phi_0$ goes high so that the function $f(\alpha_0, /\alpha_0)$ is computed in the forward logic function circuit 31.

When T=1, since the clock $\phi_1$ goes high and the first switch 315 is turned on to then form a current path of the forward logic function computing unit 311, the output $X_1$ goes high. Here, since a complete swing at the node (a) cannot be achieved due to a threshold voltage of the NMOS transistor (not shown) constituting the forward logic function computing unit 311, the reduced swing is compensated using a pair of PMOS transistors QP1 and QP3 having gates cross-coupled to the output nodes $X_1$ and $/X_1$. That is, if the node (a) becomes high, the first switch 315 is turned on so that the output $X_1$ goes high. As the output $X_1$ becomes high and then the first NMOS transistor QN1 of the clamping circuit 37 is turned on, the complementary output $/X_1$ is grounded. Also, since the complementary output $/X_1$ is grounded, the first PMOS transistor QP1 is turned on. As a result, as the first PMOS transistor QP1 is in an ON state, the node (a) and the output $X_1$ accurately follow the clock $\phi_1$ until it is raised to the maximum power supply voltage level $V_{dd}$.

When T=2, the inverse inputs $\beta_2$ and $/\beta_2$ which are outputs of a subsequent stage become valid after the clock $\phi_2$ goes high. Then, the function $g^{-1}(\beta_2, /\beta_2)$ is computed in the reverse logic function circuit 33.

When T=3, the node (b) and the output $X_1$ accurately follow the clock $\phi_3$ with an aid of the second PMOS transistor QP2, in the same manner as T=1, as described above.

When T=4, the clock $\phi_0$ goes low and the clock $\phi_4$ goes high. Accordingly, the third and fourth switches 335 and 337 are turned on and the first and second switches 315 and 317 are turned off. During the switching operation, the nodes b and $X_1$ are high and the nodes /b and $/X_1$ are grounded. Thus, non-adiabatic charging/discharging energy dissipation is not generated.

When T=5, if the clock $\phi_1$ is grounded, the charges of the node (a) and the internal nodes of the forward logic function circuit 31 are restored into the clock $\phi_1$ while the output value $X_1$ is kept high.

When T=6, since the clock $\phi_2$ is grounded, the inputs $\alpha_0$ and $/\alpha_0$ are deactivated to then be grounded.

When T=7, as the clock $\phi_3$ is grounded, the charge of the output value $X_1$ is restored to the clock $\phi_3$. Also, the charges of the node (b) and the internal nodes of the reverse logic function circuit 33 are restored into the clock $\phi_3$. Then, all internal nodes are grounded like at the initial stage.

Figure 13:
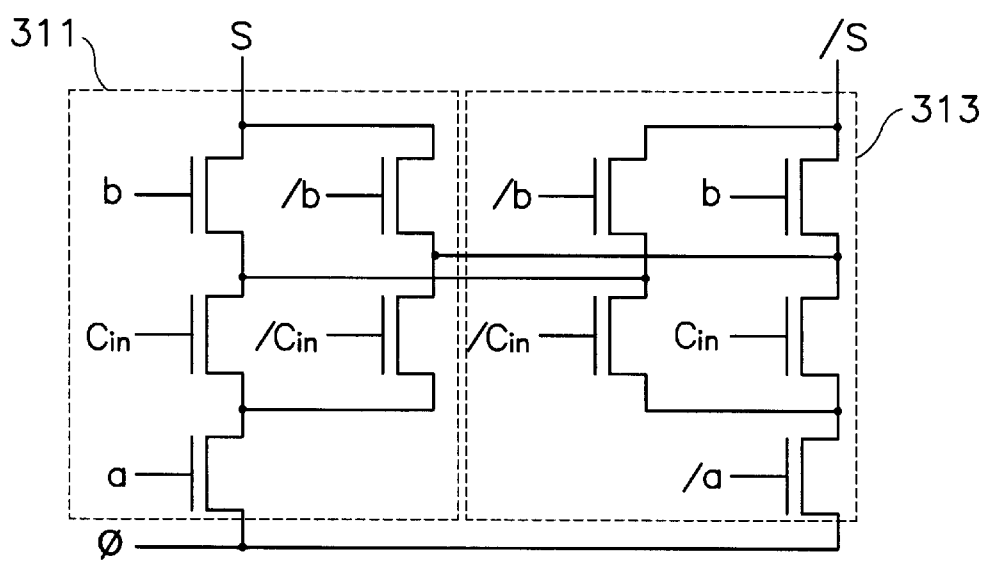
FIG. 13 shows an exemplary implementation of a logic function computing unit and a complementary logic function computing unit of a full adder using NMOS transistors in FIG. 5.

FIG. 13 shows an exemplary implementation of a forward logic function computing unit 311 and a complementary forward logic function computing unit 313 using NMOS transistors, for obtaining the sum (S) of the full adder, in FIG. 10, that is, S=a XOR b XOR $C_{in}$. In FIG. 13, the compensation circuit 35, the clamping circuit 37 and switches 315 and 317 are not shown.

Now, energy dissipation of the full adder implemented by the NMOS transistors shown in FIG. 13 and that implemented by the transmission gates shown in FIG. 5 will be described. According to the reversible adiabatic logic circuit of the present invention, the number of transistors for the full adder shown in FIG. 13 is reduced by about 22% of that for the full adder shown in FIG. 5, thereby reducing the load capacitance of the respective nodes. Thus, the energy dissipation of the full adder shown in FIG. 13 is about 40% that of the full adder shown in FIG. 5.

As described above, in a reversible adiabatic logic circuit according to the present invention and a pipelined reversible adiabatic logic apparatus employing the same, logic function computing units are implemented by NMOS transistors only, and a decrease in the swing due to a threshold voltage during the operation of the NMOS transistors is compensated using a pair of PMOS transistors having gates cross-coupled to the output nodes, thereby avoiding non-adiabatic energy dissipation, and greatly reducing the circuit area compared to the conventional case in which the logic function computing units are implemented by transmission gates. Also, since the reversible adiabatic logic circuit is used as to low-power logic circuit, it can be applied to reversible computer technology.

While this invention has been described in connection with what is presently considered to be the most practical and preferred embodiments, it is to be understood that the invention is not limited to the disclosed embodiment, but, on the contrary, it is intended to cover various modifications and equivalent arrangements included within the spirit and scope of the appended claims.

What is claimed is:

1. A reversible adiabatic logic circuit comprising:
 a forward logic function circuit driven by a first clock among power supply clocks having at least 8 phases during a time period, the forward logic function circuit for computing a forward logic function of a complementary dual rail using one or more NMOS transistors and determining the charging path of an output node;
 a reverse logic function circuit driven by a second clock, at least 2 phases behind the first clock, the reverse logic function circuit for computing a reverse logic function of the complementary dual rail using one or more NMOS transistors and determining the discharging path of the output node; and
 a compensation circuit for compensating a decrease in the swing of the output node due to threshold voltages of the NMOS transistors in the forward logic function circuit and the reverse logic function circuit.

2. The reversible adiabatic logic circuit according to claim 1, further comprising a clamping circuit consisting of two NMOS transistors serially connected between the output node and its complementary output node.

3. The reversible adiabatic logic circuit according to claim 2, wherein the forward logic function circuit comprises:
 a logic forward function computing unit having one or more NMOS transistors, the forward logic function computing unit for computing a forward logic function for the output value of a previous stage using the first clock;
 a first switch driven by a third clock, one phase ahead of the first clock, the first switch for transferring the output of the forward logic function computing unit to the output node;
 a complementary forward logic function computing unit having one or more NMOS transistors, the complementary forward logic function computing unit for computing a complementary forward logic function for the complementary output value of a previous stage using the first clock; and
 a second switch driven by the third clock, for transferring the output of the complementary forward logic function computing unit to the complementary output node.

4. The reversible adiabatic logic circuit according to claim 3, wherein the reverse logic function circuit comprises:

a reverse logic function computing unit having one or more NMOS transistors, the reverse logic function computing unit for computing a reverse logic function for the output value of a next stage using the second clock;

a third switch driven by a fourth clock, one phase behind the second clock, the third switch for transferring the output of the reverse logic function computing unit to the output node;

a complementary reverse logic function computing unit having one or more NMOS transistors, the complementary reverse logic function computing unit for computing a complementary reverse logic function for the complementary output value of the next stage using the second clock; and a fourth switch driven by the fourth clock, for transferring the output of the complementary reverse logic function computing unit to the complementary output node.

5. The reversible adiabatic logic circuit according to claim 3, wherein the compensation circuit comprises:

first and second PMOS transistors in which drains and sources are connected to the output ports and the clock supply ports of the forward logic function computing unit and the reverse logic function computing unit, respectively, gates are connected to each other, and the node of the gates is connected to the complementary output node; and third and fourth PMOS transistors in which drains and sources are connected to the output ports and the clock supply ports of the complementary forward logic function computing unit and the complementary reverse logic function computing unit, respectively, gates are connected to each other, and the node of the gates is connected to the output nodes.

6. A pipelined reversible adiabatic logic apparatus having unit reversible adiabatic logic circuits, each comprising:

a forward logic function circuit driven by a first clock among power supply clocks having at least 8 phases during a time period, the forward logic function circuit for computing a forward logic function for the output value of a previous stage and its complementary forward logic function using one or more NMOS transistors and determining the charging path of an output node;

a reverse logic function circuit driven by a second clock, at least 2 phases behind the first clock, the reverse logic function circuit for computing a reverse logic function of the output value of a next stage and its complementary reverse logic function using one or more NMOS transistors and determining the discharging path of an output node; and a compensation circuit for compensating a decrease in the swing of the output node due to threshold voltages of the NMOS transistors in the forward logic function circuit and the reverse logic function circuit, wherein the unit reversible adiabatic logic circuits are pipelined and the forward logic function circuit of the unit reversible adiabatic logic circuit of the next stage is driven by a clock, one phase behind the first clock.

7. The pipeline reversible adiabatic logic apparatus according to claim 6, the compensation circuit comprises a pair of PMOS transistors in which the respective gates are cross-coupled to the output node and its complementary output nodes.

8. The pipelined reversible adiabatic logic apparatus according to claim 7, wherein the forward logic function circuit comprises:

a forward logic function computing unit having one or more NMOS transistors, the forward logic function computing unit for computing a forward logic function for the output value of the previous stage using the first clock;

a first switch driven by a third clock, one phase ahead of the first clock, the first switch for transferring the output of the forward logic function computing unit to the output node;

a complementary forward logic function computing unit having one or more NMOS transistors, the complementary forward logic function computing unit for computing a complementary forward logic function for the complementary output value of the previous stage using the first clock; and a second switch driven by the third clock, for transferring the output of the complementary forward logic function computing unit to the complementary output node.

9. The pipelined reversible adiabatic logic apparatus according to claim 7, wherein the reverse logic function circuit comprises:

a reverse logic function computing unit having one or more NMOS transistors, the reverse logic function computing unit for computing a reverse logic function for the output value of the next stage;

a third switch driven by a fourth clock, one phase behind the second clock, the third switch for transferring the output of the reverse logic function computing unit to the output node;

a complementary reverse logic function computing unit having one or more NMOS transistors, the complementary reverse logic function computing unit for computing a complementary reverse logic function for the complementary output value of the next stage; and a fourth switch driven by the fourth clock, for transferring the output of the complementary reverse logic function computing unit to the complementary output node.

10. The pipeline reversible adiabatic logic apparatus according to claim 6, further comprising a clamping circuit having two NMOS transistors connected in series between the output node and its complementary output node.

* * * * *

UNITED STATES PATENT AND TRADEMARK OFFICE
CERTIFICATE OF CORRECTION

PATENT NO. : 6,316,962 B1
DATED : November 13, 2001
INVENTOR(S) : Ki Paek Kwon

Figure 3:
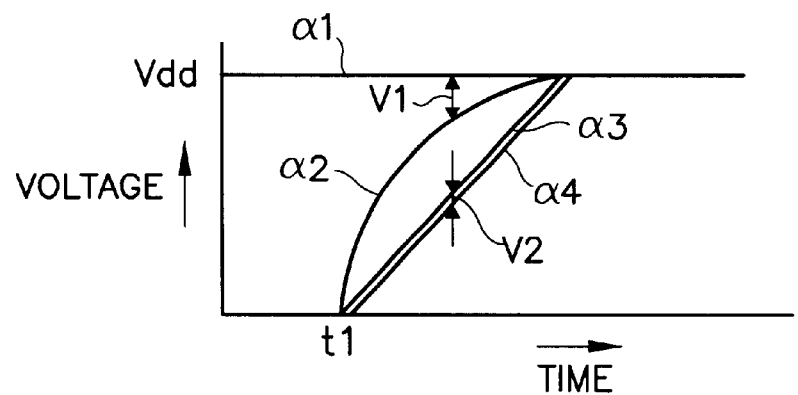
FIG. 3 is a graph for explaining a difference between a conventional charging method and an adiabatic charging method.
Figure 4:
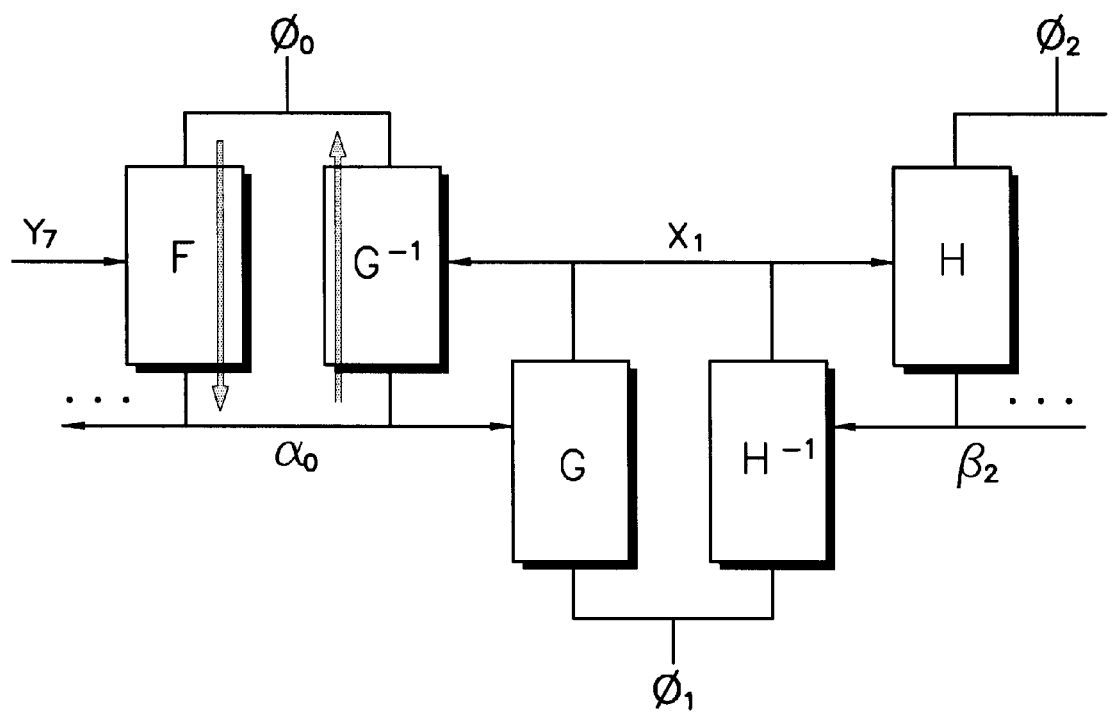
FIG. 4 shows a pipelined reversible structure.

It is certified that error appears in the above-identified patent and that said Letters Patent is hereby corrected as shown below:

Column 3,
Line 21, reads: "et al. FIG. 4 shows irreversible pipeline connection, in which"; it should read -- et al. FIG. 4 shows a reversible pipeline connection, in which --;
Line 66, reads: "being grounded. When T=3, a clock ϕ3 goes high and"; it should read -- being grounded. When T=3, a clock $\phi_3$ goes high and --;

Column 6,
Line 5, reads: "to a clock ϕ$_i$;, receives energy from the clock ϕ$_i$. computes"; it should read -- to a clock ϕ$_i$, receives energy from the clock ϕ$_i$, computes --;

Column 8,
Line 52, reads: "TIhe clamping circuit 37 includes first and second NMOS"; it should read -- The clamping circuit 37 includes first and second NMOS --;

Signed and Sealed this

Twenty-first Day of May, 2002

Attest:

Attesting Officer

JAMES E. ROGAN
Director of the United States Patent and Trademark Office